United States Patent
Nagy et al.

[19]

[11] Patent Number: 6,158,688
[45] Date of Patent: Dec. 12, 2000

[54] DRIVE MECHANISM FOR TRANSPORTING A TOW AT CONSTANT SPEED

[75] Inventors: Endre Nagy, Alkmar; Antonio Dias, Alkmaar; Edward Bullock, Bergen, all of Netherlands

[73] Assignee: European Atomic Energy Community (Euratom), Luxembourg, Germany

[21] Appl. No.: 09/254,540

[22] PCT Filed: Sep. 1, 1997

[86] PCT No.: PCT/EP97/04735

§ 371 Date: Mar. 10, 1999

§ 102(e) Date: Mar. 10, 1999

[87] PCT Pub. No.: WO98/09902

PCT Pub. Date: Mar. 12, 1998

[30] Foreign Application Priority Data

Sep. 9, 1996 [EP] European Pat. Off. .............. 96114406

[51] Int. Cl.[7] .................................................. B65H 54/02
[52] U.S. Cl. ...................................... 242/472.1; 242/538.1
[58] Field of Search .............................. 242/472.1, 535.3, 242/538.1; 28/282, 299, 217; 26/1; 156/166; 428/299.7; 427/172, 175, 209, 576; 118/718, 33

[56] References Cited

U.S. PATENT DOCUMENTS

| | | |
|---|---|---|
| 1,306,094 | 6/1919 | Beadle . |
| 2,350,549 | 6/1944 | Eslinger . |
| 2,517,055 | 8/1950 | Thompson . |
| 4,625,930 | 12/1986 | Urlik ...................................... 242/333.4 |
| 5,196,100 | 3/1993 | Goffetre et al. ........................... 118/33 |
| 5,547,512 | 8/1996 | Gabor et al. ............................. 118/718 |
| 5,984,225 | 11/1999 | Enzinna ................................. 242/415 |
| 5,992,791 | 11/1999 | Tsuda et al. ......................... 242/535.3 |

FOREIGN PATENT DOCUMENTS 0 479 679 A1 4/1992 European Pat. Off. .

*Primary Examiner*—Donald P. Walsh
*Assistant Examiner*—Collin A. Webb
*Attorney, Agent, or Firm*—Sughrue, Mion, Zinn, Macpeak & Seas, PLLC

[57] ABSTRACT

The present invention relates to a drive mechanism (2) for transporting a tow (4) at constant speed between feed and receive reels (5, 6), an interlayer tape (7) being interleaved on both reels (5,6) between successive windings of the tow. According to the invention, said tape is drivingly coupled between the two reels (5,6) to a drive wheel (9) and each reel is further drivingly coupled to the drive wheel (9) via a slip mechanism (18, 19). Preferred application: driving fibres through a CVD chamber.

6 Claims, 2 Drawing Sheets

DRIVE MECHANISM FOR TRANSPORTING A TOW AT CONSTANT SPEED

This invention refers to a drive mechanism for transporting a tow at constant speed between feed and receive reels, an interlayer tape being interleaved on both reels between successive windings of the tow.

Driving a tow at constant speed between two reels requires special measures due to the variable spool thickness on the two reels during the tow transfer between the two reels. If a drive motor is directly coupled to the receiving reel, the transfer speed is low at the beginning, as long as the receiving spool is nearly empty, and high at the end, when the receiving spool has a large diameter. Constant transfer speed, however, is an essential requirement, if the tow is to be treated between the two reels, for example by a CVD process (Chemical Vapour Deposition).

Thus, for example, 30-m-long fibre tows constituted by 5000 monofilaments with a filament diameter of about 10 $\mu$m have to be conveyed through a CVD chamber of 2-m length with minimum tangling and without touching the chamber walls.

It could be imagined to control the speed of the driving motor coupled to the receive reel in such a way that the rotation of said reel is controlled as a function of the spool diameter on said wheel. Such a control device, however, is complex, especially if it is to be adapted to various nominal transport speed values, and requires precise detectors for measuring the spool diameter of the receiving reel. The invention aims to render the device more simple and to improve the transport speed accuracy.

This aim is achieved by the fact that the interlayer tape, which is interleaved between successive windings of the tow on both reels for protecting the CVD layers on the tow, is drivingly coupled between the two reels to a drive wheel and that each reel is drivingly coupled to the drive wheel via a slip mechanism.

Thus, the drive wheel is not rigidly connected to one of the reels and is not subjected to a speed adjustment in accordance with the spool diameter of the driven reel. It can be directly coupled to a constant speed drive motor or a step motor.

For items of preferred embodiments of the present invention, reference is made to the secondary claims.

The invention will now be described in more detail by means of a preferred embodiment and the enclosed drawings.

Figure 1:
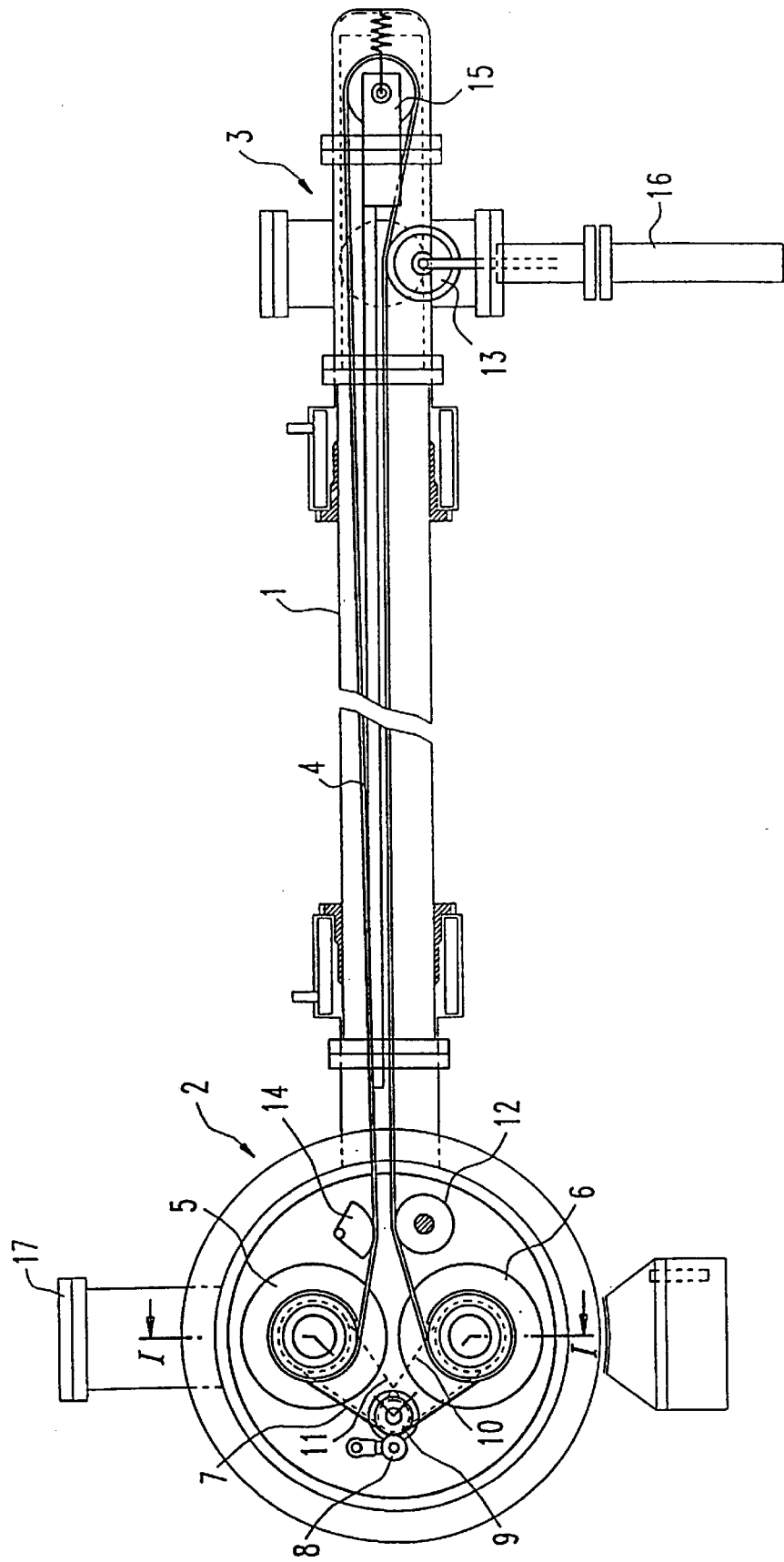
FIG. 1 represents a longitudinal cut view of a CVD chamber including the tow drive mechanism according to the invention.

The CVD chamber shown in FIG. 1 comprises a CVD reactor tube 1 having for example a length of 2 meters. The CVD chamber is classical and its details such as heating or cooling means, CVD-agent injection means and pumps are not shown.

This chamber is associated to a drive mechanism unit 2 on the left side and a tensioning device 3 on the right side of the figure. A tow 4, for example 30 meters long, passes twice through the chamber 1 and is supplied and received by two reels 5 and 6 mounted in the drive mechanism unit 2.

The tow can be constituted by an elongate object of any adequate material to be treated in the chamber 1, by individual fibres or by a tow of fibres, this last mentioned application constituting the preferred application case on which the present description is based.

In order to prevent the newly formed coatings on the tow from interacting after the tow has been wound on the receiving reel, a protective tape 7 is interleaved between successive windings of the tow on both reels. As it will be seen hereafter in connection with FIG. 3, this tape does not pass through the chamber 1 and it is unwound from the supply reel during the transport of the tow, and immediately thereafter it is interleaved between successive windings of the treated tow on the receive reel. Between these two reels, it only passes over a drive wheel 9 to which a motor (not shown) supplies a constant speed, as it is required by the respective CVD process, and which is applied against a freely rotatable convey wheel 8. The speed at which the tape 7 is driven by the drive wheel 9 or the convey wheel 8 is exactly identical to the transfer speed of the tow 4 through the chamber. It is independent of the spool diameter on the two reels.

Figure 2:
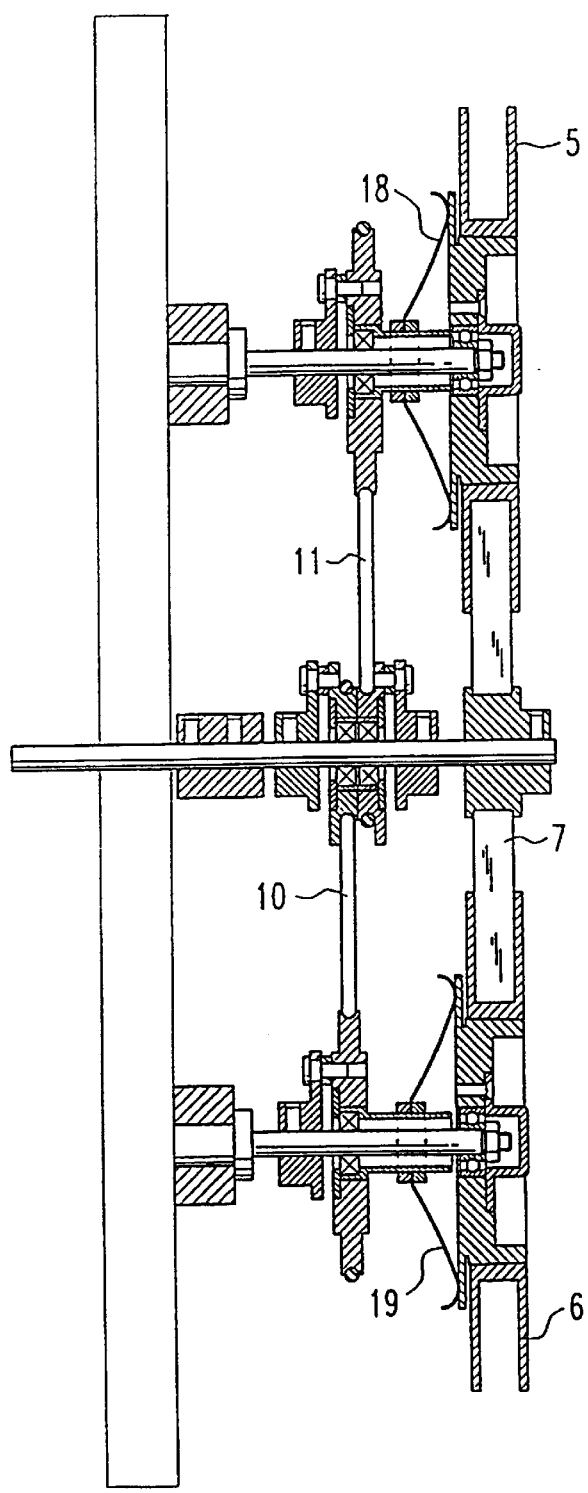
FIG. 2 shows in an enlarged scale a cut view according to line I—I in FIG. 1 through the axes of the reels and the drive wheel wheel.

As it can be seen from FIG. 2, the convey wheel 8 is coupled to the two reels 5 and 6 not only through the tape but also through rubber belts 10 and 11 which activate a slip coupling system 18, 19 of the two reels. The function of the slip coupling is to maintain a constant linear speed of both reels irrespective of the amount of tow wound on the two reels 5 and 6. This allows a continuous slip of the supply reel in accordance with the traction provided by the tape 7 and a continuous traction force for the receiving reel in accordance with the adjustable slip force. It should be noted that the transfer speed of the tow 4 is directly related to the rotational speed of the drive wheel 9, whereas the rotational speeds of the reels 5 and 6 are continuously variable in accordance with their filling state and due to the slip coupling.

A particular advantage of the drive mechanism according to the invention is constituted by the possibility to reverse the transport direction without having to change the coupling between the motor and the two reels. Thus, the CVD process can be repeated several times by a to-and-fro movement of the tow, and it is even possible to perform different cycles at different transfer speeds. As no speed regulation loop is required according to the invention, the modification of the processing speed does not require the modification of such a loop.

The path of the to-and-fro movement of the tow through the chamber 1 is defined by guide rollers such as 12 and 1, by a stationary guide element such as 14 and by a prestressed tail pulley in the tensioning device 3 remote from the drive mechanism 2. At least one of the guide rollers can be adjusted by means of a micrometer screw 16 in order to adapt the path of the tow to the particular CVD mission. These roller render the path of the tow through the chamber independent of the respective filling state of the two reels.

FIG. 3 shows schematically different steps of a CVD treatment for a tow 4. A preliminary phase concerns the loading of the tape 7 onto reel 6. To this end, the guide roller 12 is temporarily removed and replaced by a vendors' tape reel for this operation, shown in FIG. 3a. Then, the end of the tape and the end of the tow are secured to reel 5, and tow 4 can be interleaved with tape 7 onto reel 5 (see FIG. 3b). The drive wheel 9 drives the tape 7 and thus ensures the winding-up of the tow 4 onto the reel 5 and of the tape between the individual windings. As soon as the entire length of for example 30 meters of tow has been wound on the reel 5, the free end of the tow 4 is drawn through the chamber 1, wound about the tensioning wheel 3 and returned through the chamber 1 for being attached to the second reel 6 (see FIG. 3c). Now, a chamber lid 17 is closed, the chamber is evacuated, and the CVD process can begin. During this process, the tow passes once or several times through the chamber from one reel to the other, whereas the tape remains all the time in the drive mechanism unit 2 on the left side of the chamber 1. After each pass through the chamber 1, the tow is received on the receiving reel together with the tape 7, thus avoiding any interaction between the newly made coatings of adjacent tow windings.

Figure 3A:
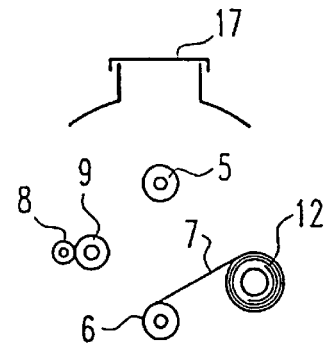
FIG. 3 shows schematically characteristic steps of operation of the mechanism according to the invention.
Figure 3B:
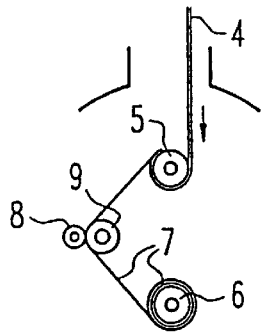
Figure 3C:
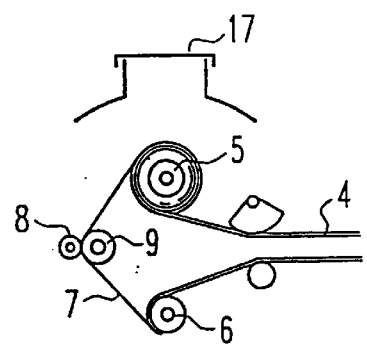
Figure 3D:
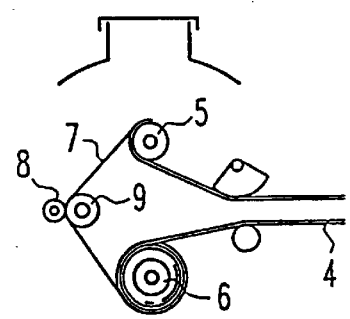

FIG. 3d shows the spool situation at the end of the first or any successive odd cycle. Preferably, the end of the process is selected after an even cycle, such that the final tow can be extracted from the upper reel 5 through the lid 17 in the casing of the drive mechanism unit.

The invention is not restricted to the application as described above in connection with the drawings. In particular, the tow may simply be constituted by a unique fibre or by a band-like material which is to be treated by any physical or chemical process in the chamber 1. Moreover, it is not necessary to transfer the tow twice through the chamber 1. In fact, the return path could lie outside the chamber and there might even be no return path at all, the two reels being located in this case on opposite sides of the processing chamber 1. Of course, in this latter case, the tape 7 would pass as before outside the chamber over the drive wheel or a convey wheel associated therewith and the slip coupling would interconnect the two reels and the convey wheel.

In the frame of the present invention as claimed, the CVD chamber can be replaced by any device requiring a constant speed movement of an elongate element, such as a photographic film spool during the development process.

The reels as well as the convey wheel can be provided with a reverse rotation blocking device.

What is claimed is:

1. A drive mechanism for transporting a tow (4) at constant speed between feed and receive reels (5, 6), an interlayer tape (7) being interleaved on both reels between successive windings of the tow, characterized in that said tape (7) is drivingly coupled between the two reels (5, 6) to a drive wheel (9), each reel (5, 6) is drivingly coupled to the drive wheel (9) via a slip mechanism (18, 19).

2. A drive mechanism according to claim 1, characterized in that a convey wheel (8) applies the tape against the drive wheel and that the slip mechanism (18, 19) is coupled to said drive wheel (9).

3. A drive mechanism according to claim 1, characterized in that both reels (5, 6) and the drive wheel (9) are located in a common drive mechanism unit (2) and that a free running tail pulley (15) is provided away from said unit for reverting the direction of the tow, whereas the tape remains completely within the drive mechanism unit (2).

4. A drive mechanism according to claim 3, characterized in that the tail pulley (15) is submitted to an elastic force intended to ensure a constant tension load to said tow (4).

5. A drive mechanism according to claim 1, characterized in that free running guide rollers (12, 13) are located between the reels (5, 6) in order to guide the tow (4) between the reels on a defined path independently from the spool diameter on the respective reel.

6. A drive mechanism according to claim 1, characterized in that it is applied to a device (1) for treating the surface of fibres by CVD process, the fibres being supplied in a tow assembly (4).

* * * * *